United States Patent
Sinclair

(12) 
(10) Patent No.: US 6,708,492 B2
(45) Date of Patent: *Mar. 23, 2004

(54) RESONANT THERMAL OUT-OF-PLANE BUCKLE-BEAM ACTUATOR

(75) Inventor: Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/052,169

(22) Filed: Jan. 17, 2002

(65) Prior Publication Data

US 2002/0088224 A1 Jul. 11, 2002

Related U.S. Application Data

(63) Continuation-in-part of application No. 09/703,201, filed on Oct. 31, 2000.

(51) Int. Cl.[7] .................................................. F01B 29/10
(52) U.S. Cl. .......................................... 60/527; 60/528
(58) Field of Search ................................... 60/527, 528

(56) References Cited

U.S. PATENT DOCUMENTS

| | | | | |
|---|---|---|---|---|
| 5,061,914 A | * | 10/1991 | Busch et al. | 337/140 |
| 5,619,177 A | * | 4/1997 | Johnson et al. | 337/140 |
| 5,994,816 A | | 11/1999 | Dhuler et al. | 310/307 |
| 6,023,121 A | | 2/2000 | Dhuler et al. | 310/307 |
| 6,130,464 A | | 10/2000 | Carr | 257/417 |
| 6,422,011 B1 | * | 7/2002 | Sinclair | 60/528 |

* cited by examiner

*Primary Examiner*—Hoang Nguyen
(74) *Attorney, Agent, or Firm*—Ipsolon LLP

(57) ABSTRACT

An out-of-plane thermal buckle-beam microelectrical mechanical actuator is formed on a planar substrate of semiconductor material (e.g., silicon). The actuator includes first and second anchors secured to the substrate and multiple elongated thermal buckle beams that are secured between the anchors. The buckle beams are formed of semiconductor material, such as polysilicon. In one implementation, the buckling beams are coupled together by a pivot frame that includes a frame base secured to each buckle beam and at least one pivot arm that is coupled to the frame base at one end and includes a free end that pivots out-of-plane when the actuator is activated. A cyclic current source directs cyclic electrical current through the thermal buckle beams via the anchors to impart thermal expansion of the buckle beams and hence a cyclic buckling motion of them out of the plane (i.e., away from) the substrate. In one implementation, the actuator has a characteristic resonant deflection frequency range and the cyclic current is of a first frequency within the resonant deflection frequency range.

36 Claims, 11 Drawing Sheets

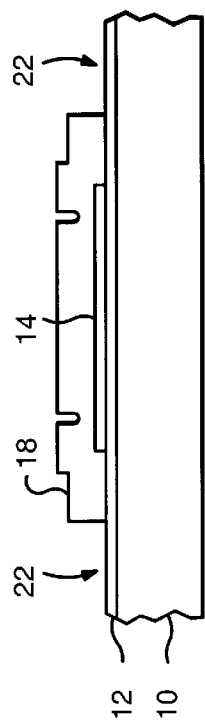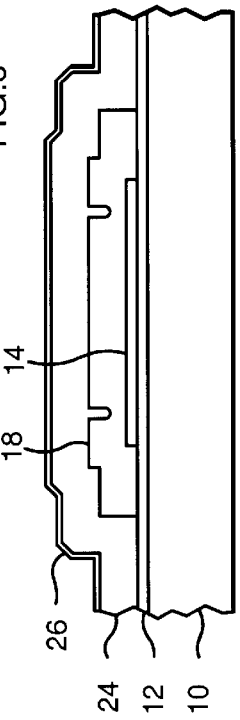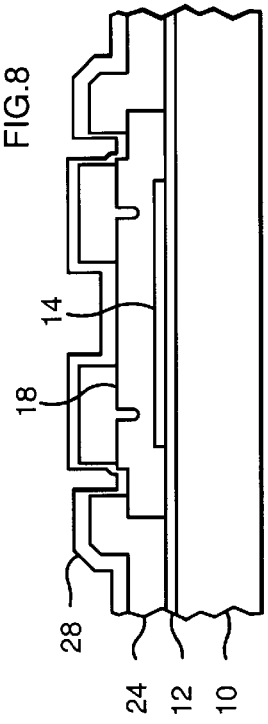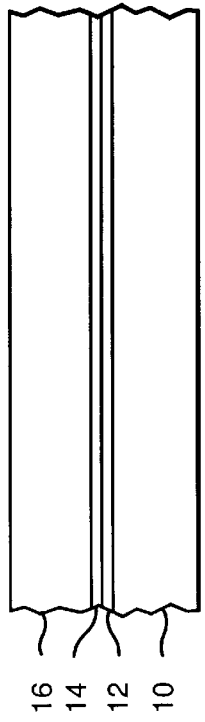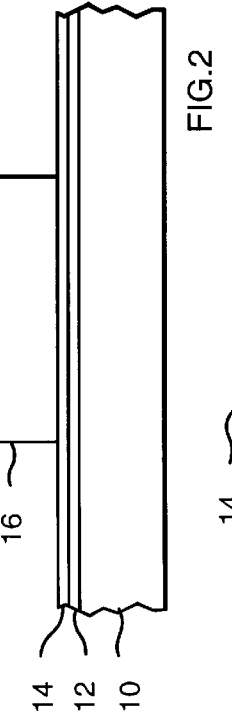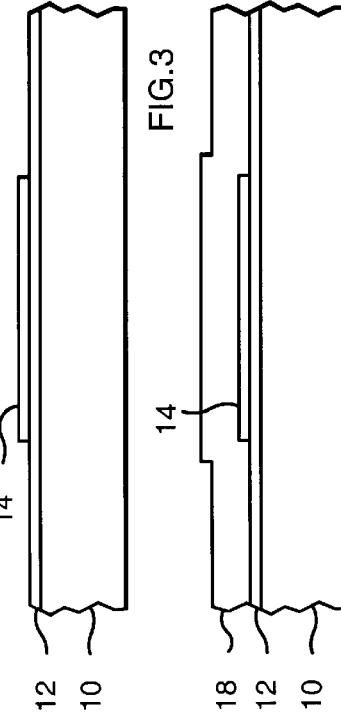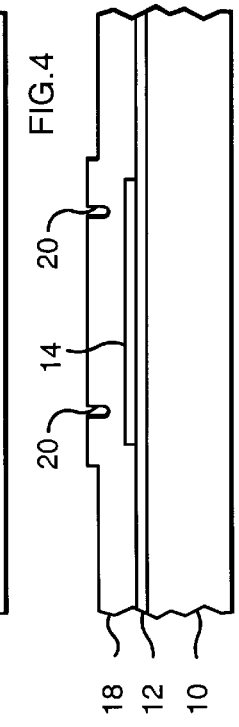

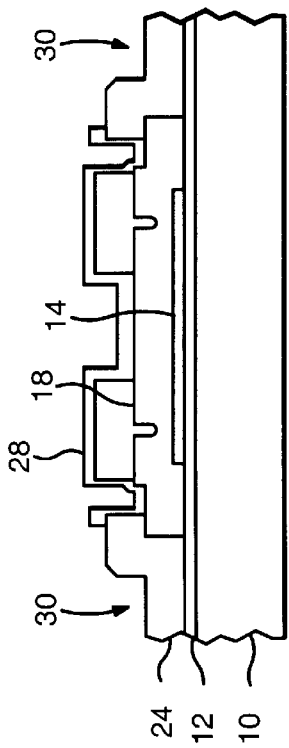
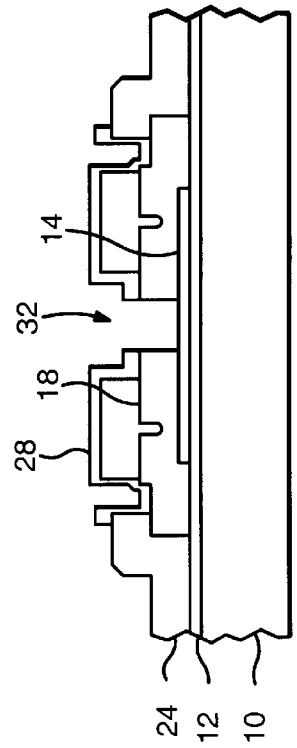
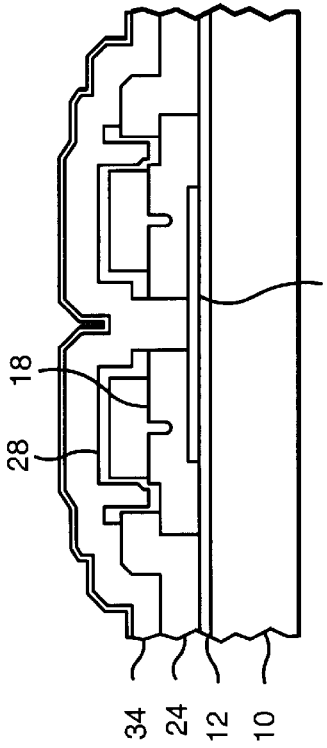
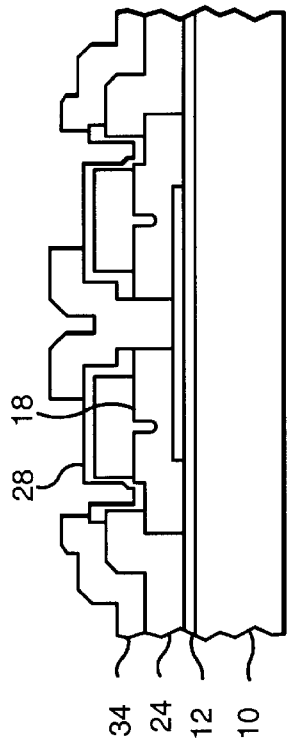
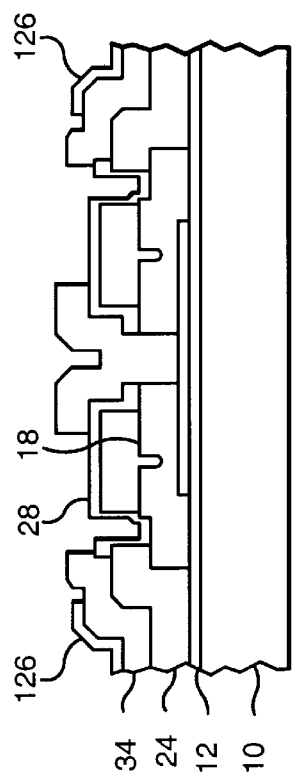
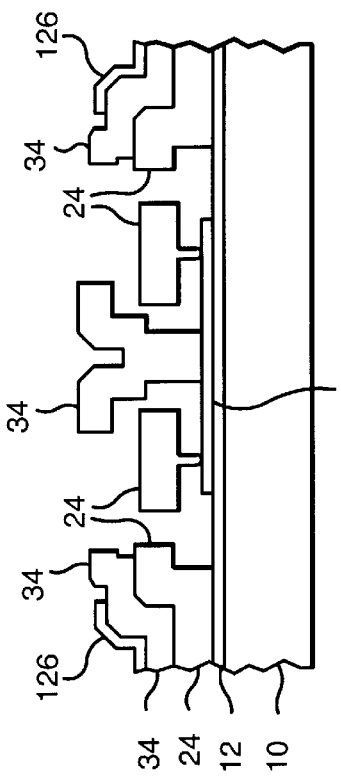

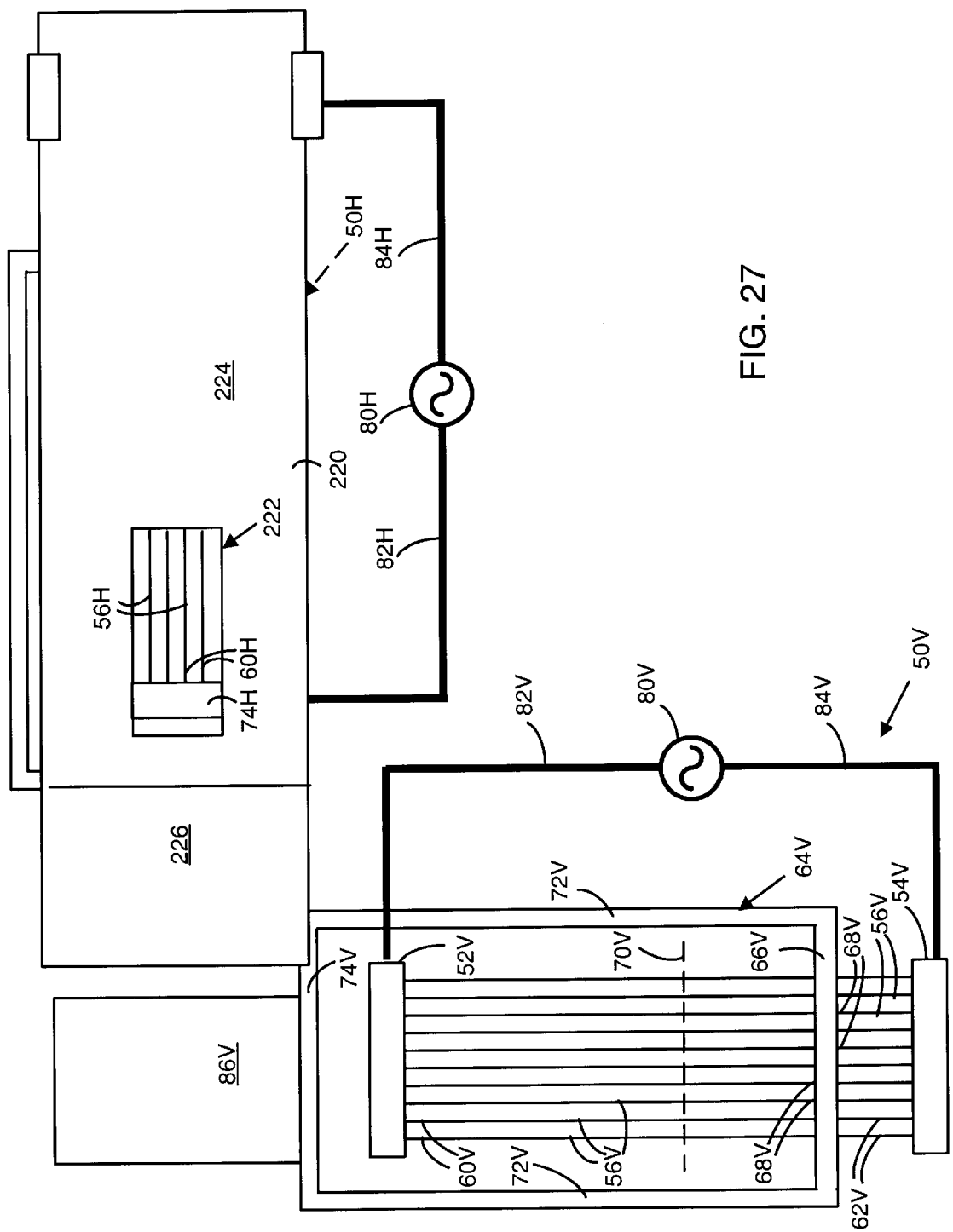

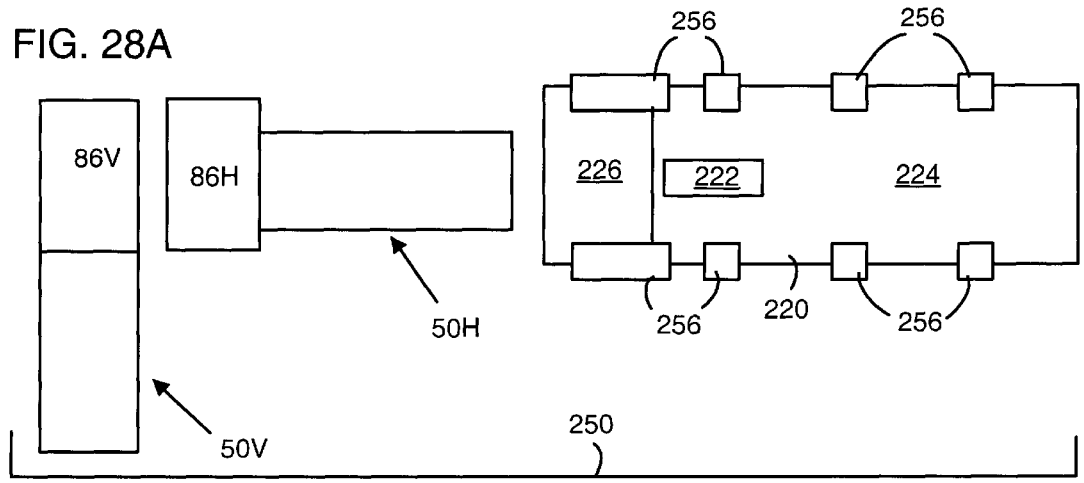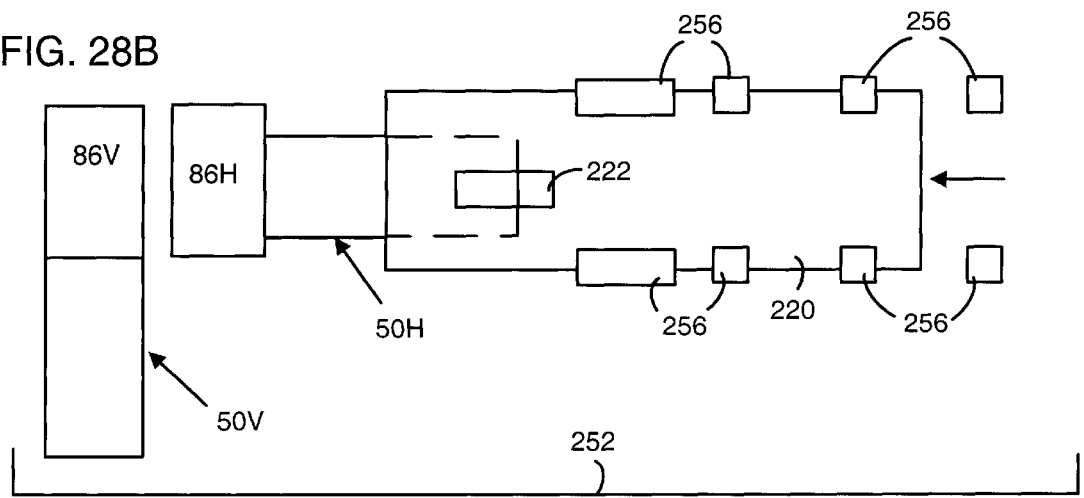

RESONANT THERMAL OUT-OF-PLANE BUCKLE-BEAM ACTUATOR

RELATED APPLICATION

This is a continuation-in-part of application Ser. No. 09/703,201, filed Oct. 31, 2000.

FIELD OF THE INVENTION

The present invention relates to microelectromechanical system (MEMS) actuators and, in particular, to thermal microelectromechanical system actuators that are activated by Joule heating.

BACKGROUND AND SUMMARY OF THE INVENTION

Microelectromechanical system (MEMS) actuators provide control of very small components that are formed on semiconductor substrates by conventional semiconductor (e.g., CMOS) fabrication processes. MEMS systems and actuators are sometimes referred to as micromachined systems-on-a-chip.

One of the conventional MEMS actuators is the electrostatic actuator or comb drive. Commonly, such actuators include two comb structures that each have multiple comb fingers aligned in a plane parallel to a substrate. The fingers of the two comb structures are interdigitated with each other. Potential differences applied to the comb structures establish electrostatic interaction between them, thereby moving the comb structures toward and away from each other.

Advantages of the electrostatic actuator are that they require low current, which results in small actuation energy, and have a relatively high frequency response. Disadvantages are that they require high drive voltages (e.g., tens or hundreds of volts) and large areas and provide low output forces. Comb drive (electrostatic) actuators used for deployment of microstructures typically occupy many times the area of the device they are deploying. Also, the high voltages (e.g., tens or hundreds of volts) required to operate electrostatic actuators can be incompatible and prevent integration with conventional logic and low voltage electronics.

A pseudo-bimorph thermal actuator is an alternative to the electrostatic actuator. These actuators utilize differential thermal expansion of two different-sized polysilicon arms to produce a pseudo-bimorph that deflects in an arc parallel to the substrate. Such a thermal actuator produces much higher forces (100–400 times) per unit volume than comb drive actuators and can operate on very low voltages. Such actuators are limited to sweeping or arc motion in the plane of the actuator.

The present invention includes an out-of-plane thermal buckle-beam microelectrical mechanical actuator formed on a planar substrate of semiconductor material (e.g., silicon). The actuator includes first and second anchors secured to the substrate and multiple elongated thermal buckle beams that are secured between the anchors. The buckle beams are formed of semiconductor material, such as polysilicon. In one implementation, the buckling beams are coupled together by a pivot frame that includes a frame base secured to each buckle beam and at least one pivot arm that is coupled to the frame base at one end and includes a free end that pivots out-of-plane when the actuator is activated.

A cyclic current source directs cyclic electrical current through the thermal buckle beams via the anchors to impart thermal expansion of the buckle beams and hence a cyclic buckling motion of them out of the plane (i.e., away from) the substrate. In one implementation, the actuator has a characteristic resonant deflection frequency range and the cyclic current is of a first frequency within the resonant deflection frequency range.

Actuators according to the present invention provide out-of-plane motions with forces comparable to conventional thermal actuators. The resistivity of silicon allows the actuator to operate at voltages and currents compatible with standard integrated circuitry (e.g., CMOS). In addition, actuators according to the present invention are very small in area, have relatively high force. This electrically stimulated movement can be used in micro-motors, optical scanning devices, MEMS optical deployment mechanisms and other areas requiring mechanical movement on a micro scale. For example, an actuator structure of the present invention includes a pair or transverse actuators and an out-of plane fold mirror that cooperate to form a video raster scanner.

Additional objects and advantages of the present invention will be apparent from the detailed description of the preferred embodiment thereof, which proceeds with reference to the accompanying drawings.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

FIG. 27 is a plan view of the video raster scanner of FIG. 24.

FIGS. 28A–28D illustrate schematically one implementation of successive steps in fabricating and operating the video raster scanner of FIGS. 24 and 27.

DETAILED DESCRIPTION OF PREFERRED EMBODIMENTS

Figure 16:
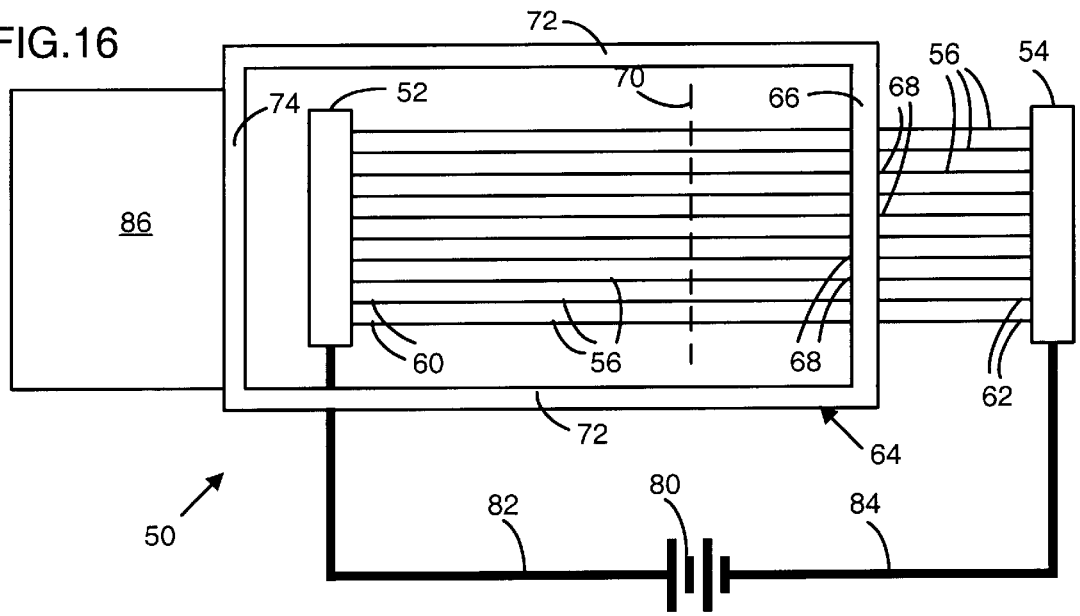
FIG. 16 is a diagrammatic plan view of a microelectrical mechanical out-of-plane thermal buckle-beam actuator according to the present invention.

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Cornwallis Road, Research Triangle Park, N.C.

The MUMPs process begins with a 100 mm n-type silicon wafer 10. The wafer surface is heavily doped with phosphorus in a standard diffusion furnace using POCl 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 12 is deposited on the silicon as an electrical isolation layer. The silicon wafer and silicon nitride layer form a substrate.

Next, a 500 nm LPCVD polysilicon film—POLY 0 14—is deposited onto the substrate. The POLY 0 layer 14 is then patterned by photolithography; a process that includes coating the POLY 0 layer with a photoresist 16, exposing the photoresist with a mask (not shown) and developing the exposed photoresist to create the desired etch mask for subsequent pattern transfer into the POLY 0 layer (FIG. 2). After patterning the photoresist, the POLY 0 layer 14 is etched in a Reactive Ion Etch (RIE) system (FIG. 3).

With reference to FIG. 4, a 2.0 $\mu$m phosphosilicate glass (PSG) sacrificial layer 18 is deposited by LPCVD onto the POLY 0 layer 14 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 20 in the First Oxide layer by RIE (FIG. 5) at a depth of 750 nm. The wafer is then patterned with a third mask layer, ANCHOR1, and etched (FIG. 6) to provide anchor holes 22 that extend through the First Oxide layer to the POLY 0 layer. The ANCHOR 1 holes will be filled in the next step by the POLY 1 layer 24.

After the ANCHOR1 etch, the first structural layer of polysilicon (POLY 1) 24 is deposited at a thickness of 2.0 $\mu$m. A thin 200 nm PSG layer 26 is then deposited over the POLY 1 layer 24 and the wafer is annealed (FIG. 7) to dope the POLY 1 layer with phosphorus from the PSG layers. The anneal also reduces stresses in the POLY 1 layer. The POLY 1 and PSG masking layers 24, 26 are lithographically patterned to form the structure of the POLY1 layer. After etching the POLY 1 layer (FIG. 8), the photoresist is stripped and the remaining oxide mask is removed by RIE.

After the POLY 1 layer 24 is etched, a second PSG layer (hereinafter "Second Oxide") 28 is deposited (FIG. 9). The Second Oxide is patterned using two different etch masks with different objectives.

First, a POLY1_POLY2_VIA etch (depicted at 30) provides for etch holes in the Second Oxide down to the POLY 1 layer 24. This etch provide a mechanical and electrical connection between the POLY 1 layer and a subsequent POLY 2 layer. The POLY1_POLY2_VIA layer is lithographically patterned and etched by RIE (FIG. 10).

Second, an ANCHOR2 etch (depicted at 32) is provided to etch both the First and Second Oxide layers 18, 28 and POLY 1 layer 24 in one step (FIG. 11). For the ANCHOR2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

A second structural layer, POLY 2, 34 is then deposited at a thickness of 1.5 $\mu$m, followed by a deposition of 200 nm of PSG. The wafer is then annealed to dope the POLY 2 layer and reduce its residual film stresses. Next, the POLY 2 layer is lithographically patterned with a seventh mask and the PSG and POLY 2 layers are etched by RIE. The photoresist can then be stripped and the masking oxide is removed (FIG. 13).

The final deposited layer in the MUMPs process is a 0.5 $\mu$m metal layer 36 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Lastly, the wafers undergo sacrificial release and test using known methods. FIG. 15 shows the device after the sacrificial oxides have been released.

In preferred embodiments, the device of the present invention is fabricated by the MUMPs process in accordance with the steps described above. However, the device of the present invention does not employ the specific mask patterns shown in the general process of FIGS. 1–15, but rather employs mask patterns specific to the structure of the present invention. Also, the steps described above for the MUMPs process may change as dictated by the MEMS Technology Applications Center. The fabrication process is not a part of the present invention and is only one of several processes that can be used to make the present invention.

FIG. 16 is a diagrammatic plan view of a microelectrical mechanical out-of-plane thermal buckle-beam actuator 50 according to the present invention. Actuator 50 includes a pair of structural anchors 52 and 54 that are secured to a substrate (e.g., substrate 10 or nitride layer 12, not shown) and one or more thermal buckle beams 56 (multiple shown) that are secured at their base ends 60 and 62 to anchors 52 and 54, respectively. Buckle beams 56 are substantially the same and extend substantially parallel to and spaced-apart from the substrate and are released from it other than at anchors 52 and 54.

Figure 17:
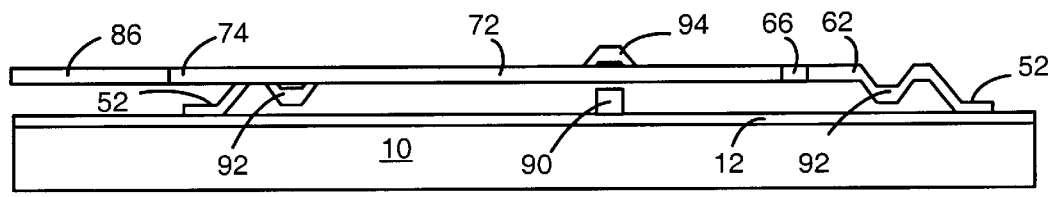
FIG. 17 is a diagrammatic side view of the actuator of FIG. 16 in a relaxed state.

A pivot frame 64 includes a frame base 66 that is secured to buckle beams 56 at coupling points 68 that in one implementation are positioned between buckle beam midpoints (indicated by dashed line 70) and one of anchors 52 and 54 (e.g., anchor 54). Pivot frame 64 further includes at least one pivot arm 72 (two shown) that is coupled to frame base 66 at one end and extends to a free end 74 that pivots out-of-plane when actuator 50 is activated. Pivot frame 64 is released and free to move, other than where frame base 66 is secured to coupling points 68. FIG. 17 is a diagrammatic side view of actuator 50 in a relaxed state illustrating pivot frame 64 as being generally parallel to or co-planar with buckle beams 56.

Figure 18:
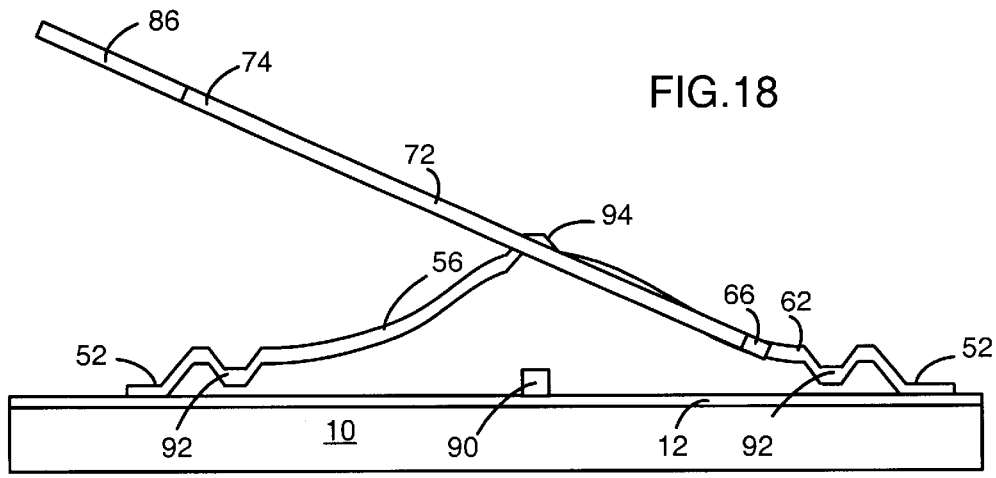
FIG. 18 is a diagrammatic side view of the actuator of FIG. 16 in an activated state.

Structural anchors 52 and 54 and buckle beams 56 have electrically semi-conductive and positive coefficient of thermal expansion properties. For example, buckle beams 56 are formed of silicon. Actuator 50 is activated when an electrical current is passed from a current source 80 through buckle beams 56 via electrically conductive couplings 82 and 84 and structural anchors 52 and 54, respectively. The applied current induces ohmic or Joule heating of buckle beams 56, thereby causing them to expand longitudinally due to the positive temperature coefficient of expansion of silicon. With anchors 52 and 54 constraining base ends 60 and 62 of buckle beams 56, the expanding buckle beams 56 ultimately buckle away from the substrate. In one implementation, buckle beams 56 are formed to have a widened aspect ratio, with widths (parallel to the substrate) greater than the thicknesses (perpendicular to the substrate), to provide a bias or predisposition for not buckling parallel to the substrate. For example, buckle beams 56 have a widened cross-sectional aspect ratio of 3:2, with widths of 3 $\mu$m, thicknesses of 2 $\mu$m, and lengths of 194 $\mu$m. FIG. 18 is a diagrammatic side view of actuator 50 in an activated state illustrating the out-of-plane buckling of buckle beams 56.

The buckling of buckle beams 56 away from the substrate in the active state of actuator 50 causes free end 74 of pivot frame 64 to pivot away from the substrate. Pivot frame 64 rotates about frame base 66, which is also raised away from the substrate by buckle beams 56. As a result, free end 74 moves and exerts a pivoting or rotational force outward away from the substrate. When the activation current ceases, buckle beams 56 cool and contract, which causes free end 74 of pivot frame 64 to return to its initial position. Such rotational deflections of pivot frame 64 may be used in a variety of applications, including providing out-of-plane deployment of other micro-mechanical structures, such as those used in micro-optical devices. In the implementation illustrated in FIGS. 16–18, for example, a mirror 86 is secured to free end 74 and pivots with pivot frame 64 to selectively deflect light according to whether actuator 50 is in its relaxed or activated state.

The widened aspect ratios of buckle beams 56 generally prevent them from buckling parallel to the substrate. Absent a bias or predisposition, the buckling of buckle beams 56 perpendicular to the substrate (e.g., FIG. 18) can arbitrarily occur away from or toward the substrate, the former being necessary for operation of actuator 50. Accordingly, FIGS. 19 and 20 illustrate bias structures that provide a bias or predisposition for buckle beam 56 to buckle away from the substrate, rather than toward it.

Figure 19:
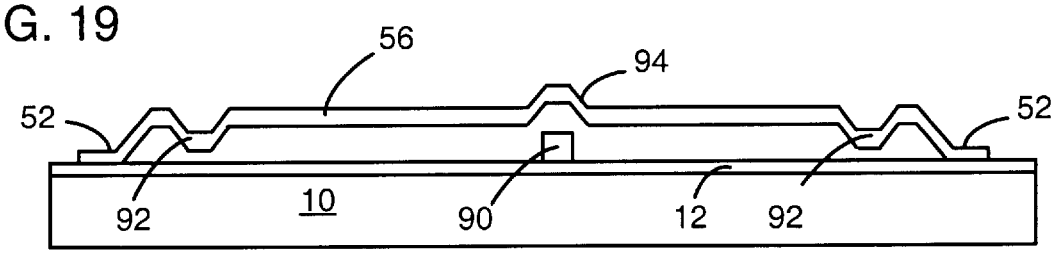
FIG. 19 is an enlarged side view illustrating a buckle beam in a relaxed state with bias structures that provide a bias or predisposition for the buckle beam to buckle away from the substrate.
Figure 20:
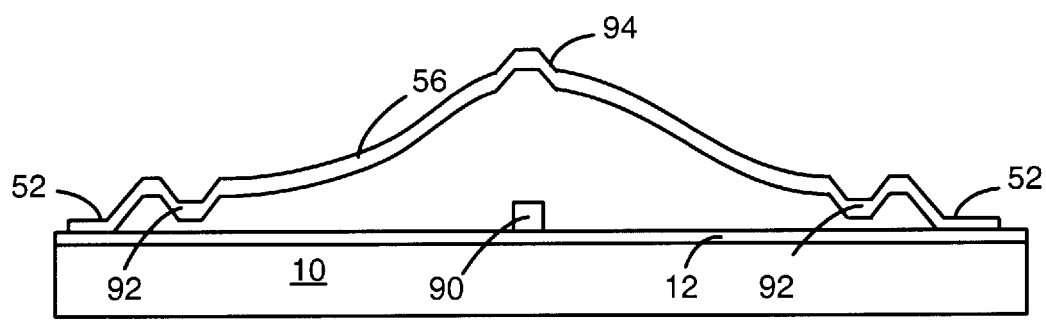
FIG. 20 is an enlarged side view illustrating a buckle beam in an actuated state with bias structures that provide a bias or predisposition for the buckle beam to buckle away from the substrate.

FIG. 19 is an enlarged side view showing an exemplary buckle beam 56 in a relaxed state extending over a spacing pad 90 that is secured to and extends from substrate 10 (e.g., the nitride layer 12) near the middle of buckle beam 56. No pivot frame is shown for purposes of clarity. FIG. 20 is an enlarged side view showing an exemplary buckle beam 56 in an activated state. For example, spacing pad 90 may be formed of a P0 layer with a thickness of 0.5 $\mu$m, and buckle beam 56 may be formed of a different (released) layer. Spacing pad 90 forces a small (e.g., 0.5 $\mu$m) hump or deflection 94 in each of buckle beams 56 due to the conformal nature of the fabrication. Also, a dimple 92 is formed near each end of buckle beam 56. Dimples 92 may be formed as a protrusion or dimple extending from a bottom surface of buckle beam 56 or as a recess into its top surface, or both, as illustrated. In a MUMPs implementation, for example, dimple 92 may be formed as is a 0.5 $\mu$m depression in the 2 um poly1 layer and does not touch the substrate.

Spacing pad 90 and dimples 92 cause buckle beams 56 to buckle away from the substrate and reduce the stiction between buckle beams 56 and the substrate (e.g., the nitride layer 12). It will be appreciated that for the multiple buckle beams 56 in a typical actuator 50, a separate spacing pad 90 could be formed for each buckle beam 56 or spacing pad 90 could be formed as a single continuous pad that extends beneath all the buckle beams 56. Spacing pad 90 and dimples 92, either individually or together, could be used alone or with a widened aspect ratio for buckle beams 56 to provide a bias or predisposition for them to buckle away from the substrate.

Initial experiments have demonstrated that actuator 50 is capable of providing pivoting or deflection of pivot frame 64 by at least about 15 degrees relative to the substrate. In one implementation, securing frame base 66 to coupling points 68 that are midway between the buckle beam midpoints and one of anchors 52 and 54 provides the greatest pivoting or deflection of pivot frame 64. Such coupling points 68 correspond to the inflection points in beams 56 when they are buckled and hence provide the greatest deflection of pivot frame 64.

Generally, the present invention is adaptable to any fabrication process that includes at least one releasable layer that has a positive temperature coefficient of expansion and is capable of carrying a current for ohmic heating. Moreover, there is no theoretical limit to the number of buckle beams 56 so long as the actuator and its associated conductors can handle the current and heat, the beams can lose heat rapidly. In one implementation, the heating temperature was kept below 800° C. to prevent self-annealing, which can cause irreversible damage.

Buckle beams 56, as well as anchors 52 and 54, can be fabricated out of either or both of the releasable MUMPs polysilicon layers, but with anchors 52 and 54 not being released. In such MUMPS implementations, actuator 50 can have possible thicknesses of 1.5, 2.0 or 3.5 $\mu$m. The resistivity of polysilicon allows the actuator to operate at voltages and currents compatible with standard integrated circuitry (e.g., CMOS). In addition, actuators according to the present invention are very small in area and have relatively high force.

In some modes of operation, mirror 86 and pivot frame 64 can form a pendulum that oscillates about frame base 66, which allows actuator 50 to operate as a resonant oscillator. In one implementation, such a resonant mode occurs at 14 kHz and provides a peak deflection of mirror 86 at about 25 degrees relative to the relaxed state. In this mode buckle beams 56 appear to assume a near-steady state buckled position, imparting a static deflection of mirror 86 and pivot frame 64. By contrast, in the non-resonant mode of this implementation actuator 50 has a half-amplitude response of about 2 KHz and a deflection of around 5 degrees.

Figure 21:
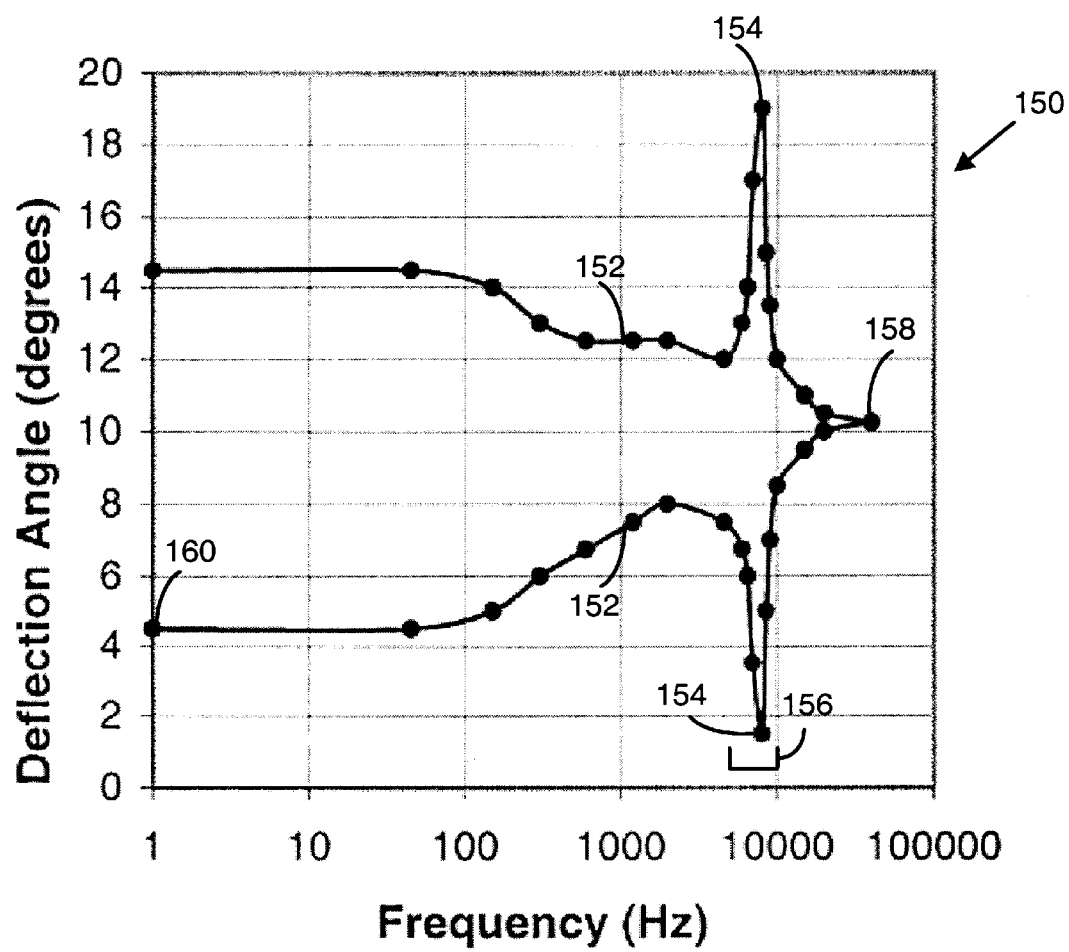
FIG. 21 is a graph showing upper and lower angular deflection limits as a function of frequency to illustrate resonant operation of an actuator of the present invention.

FIG. 21 is a graph 150 showing upper and lower angular deflection limits as a function of frequency to illustrate resonant operation of an actuator 50 of the present invention. In this illustration, actuator 50 is excited with a 4 volt square wave. Graph 150 shows a half-amplitude bandwidth at about 1 KHz (data points 152) and resonant actuator deflection at about 8 KHz (data points 154). In this implementation, resonant actuator deflection (e.g., mirror 86) has a maximum total excursion of 18 about optical degrees (i.e., out-of-plane).

The resonant actuator deflection occurs within a resonant deflection frequency range 156 that follows a frequency range of decreasing angular deflections. Resonant deflection frequency range 156 may be further characterized by larger-sloped increases (or decreases) in angular deflection.

It will be noted that at frequencies above resonance (i.e., about 8 kHz), cyclic actuator deflection decreases rapidly until the deflection assumes a static deflection value (data point 158). It is believed that in this state actuator 50 is unable to mechanically respond to the rapid heating and cooling of buckle beams 56. The static deflection value is equal to a quiescent residual stress offset of 4.5 degrees (data point 160), plus a deflection due to an RMS heating value of 2 volts for the applied square wave to give the total 10 degree offset at data point 158. The biases due to the residual stress and average heating value of the drive signal contribute to elevating mirror 86 above and avoiding collision with the substrate.

Figure 22:
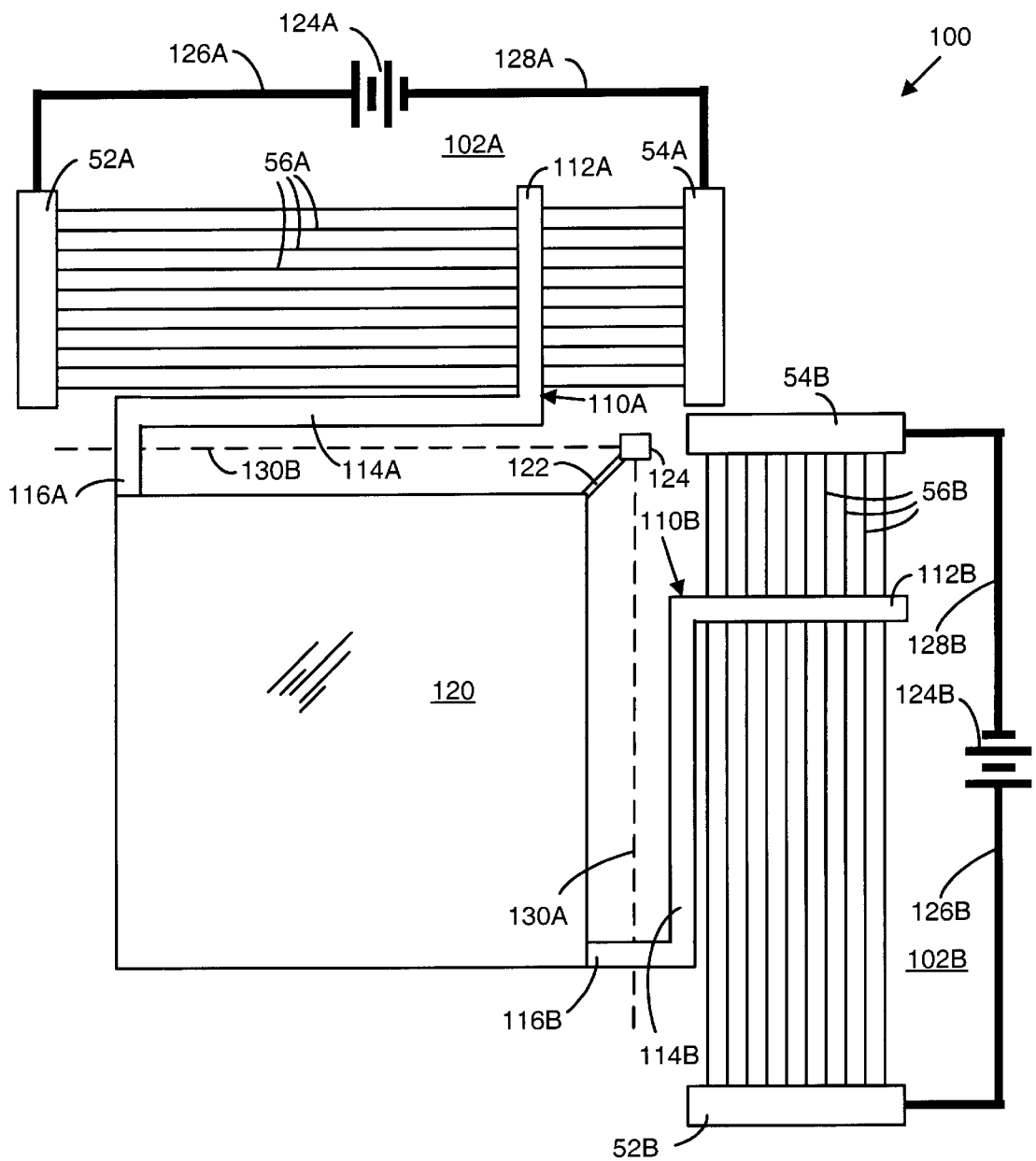
FIG. 22 is a diagrammatic plan view of an exemplary implementation of a microelectrical mechanical out-of-plane buckle-beam actuator assembly with multiple actuators.

FIG. 22 is a diagrammatic plan view of an exemplary implementation of a microelectrical mechanical out-of-plane buckle-beam actuator assembly 100 with multiple (e.g., two) actuators 102A, 102B that are positioned orthogonal to each other in alignment with adjacent sides of a rectangular (e.g., square) mirror 120. Actuators 102A, 102B are each analogous to actuator 50 described above, except that actuators 102A, 102B include pivot frames 110A, 110B that differ from pivot frame 64. Similarly, mirror 120 is analogous to mirror 86, but differs in its mounting and coupling to pivot frames 110A, 110B. The following description is directed to actuator 102A, but is similarly applicable to actuator 102B, with like components being indicated by the same reference numerals.

Actuator 102A includes a pair of structural anchors 52A and 54A that are secured to a substrate (e.g., substrate 10 or nitride layer 12, not shown) and multiple thermal buckle beams 56A that are secured at their base ends to anchors 52 and 54. A pivot frame 110A includes a frame base 112A that is secured to buckle beams 56A and one pivot arm 114A that is coupled to frame base 112A at one end and extends to a free end 116A that pivots out-of-plane when actuator 102A is activated. Free end 116A is attached to one corner of a mirror 120, which is linked by a tendon 122 to a mirror anchor 124 and is otherwise released from the substrate.

Actuator 102A is activated when an electrical current is passed from a current source 124A through buckle beams 56A via electrically conductive couplings 126A and 128A and structural anchors 52A and 54A, respectively. The applied current induces ohmic or Joule heating of buckle beams 56A, thereby causing them to expand longitudinally due to the positive temperature coefficient of expansion of silicon in the manner described above.

Actuators 102A and 102B function to tilt mirror 120 about tilt axes 130A and 130B, respectively. Actuators 102A and 102B with respective current sources 124A and 124B may be operated separately to tilt mirror 120 arbitrarily about tilt axes 130A and 130B. With coordinated operation, actuator assembly 100 and mirror 120 may be employed as a scan control mirror in a bar code or vector image scanner or to provide a raster scan pattern for image formation.

Figure 23:
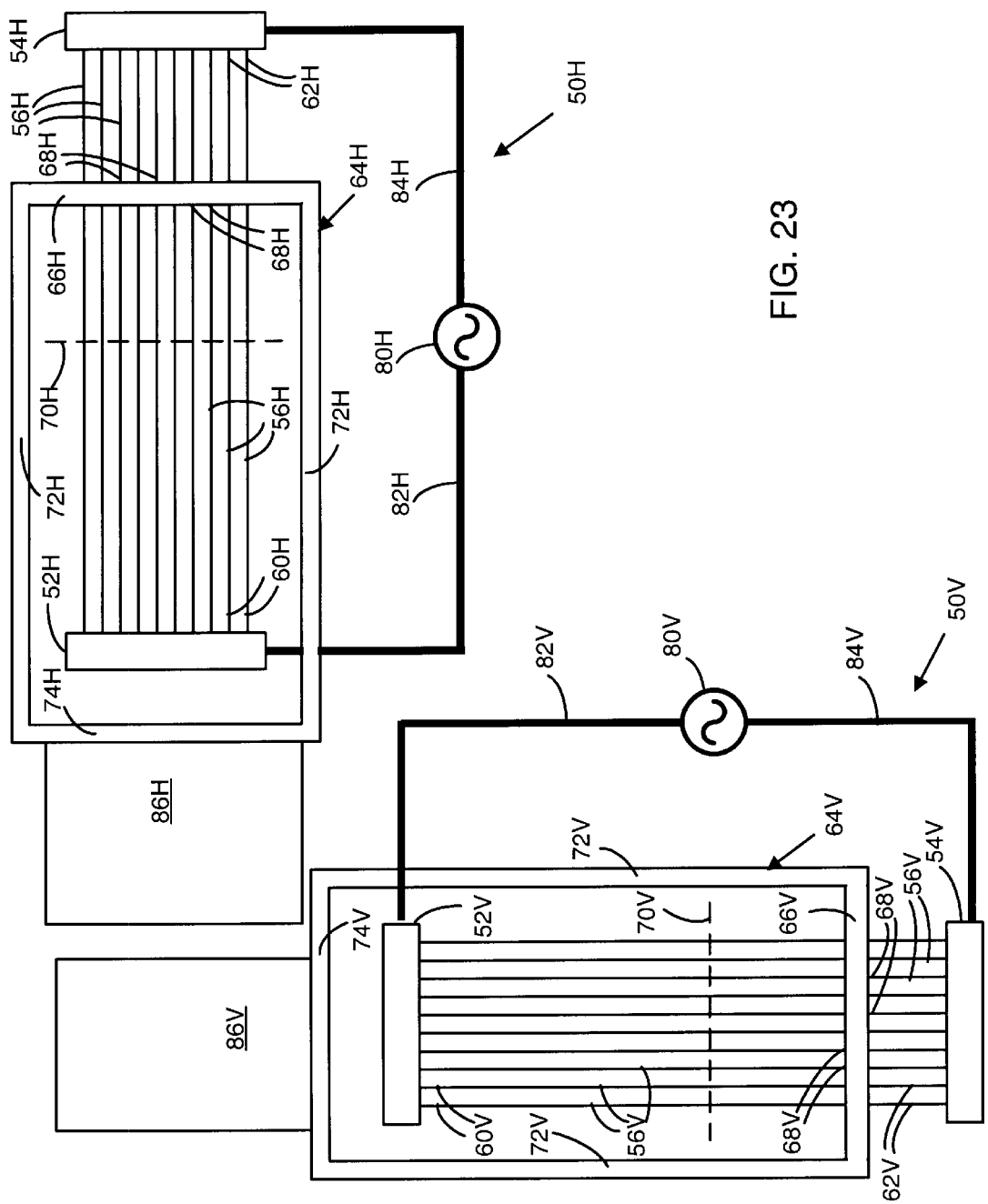
FIG. 23 is a diagrammatic plan view of a pair of microelectrical mechanical out-of-plane thermal buckle-beam actuators arranged to function together as part of a video raster scanner.
Figure 24:
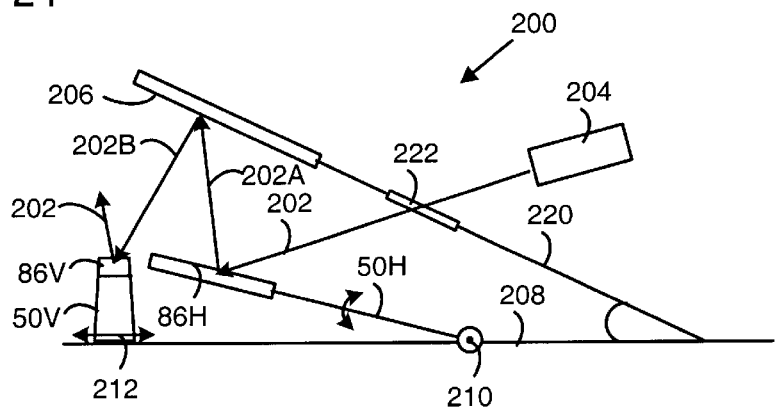
FIG. 24 is a schematic side view illustrating operation of the actuators of FIG. 23 as a video raster scanner.

FIG. 23 is a diagrammatic plan view of a pair of microelectrical mechanical out-of-plane thermal buckle-beam actuators 50H and 50V arranged to function together as part of a video raster scanner 200 (FIGS. 24 and 27). Actuators 50H and 50V are of substantially the same construction as actuator 50 of FIG. 16, so that corresponding similar components bear the same reference numerals. For example, actuators 50H and 50V include respective mirrors 86H and 86V.

Actuators 50H and 50V with mirrors 86H and 86V function to provide respective horizontal and vertical scanning of an image display light beam 202 (FIG. 24) from a display light source 204, as described below in greater detail. Actuator 50H provides high frequency horizontal scanning, and actuator 50V provides lower-frequency vertical scanning. In an NTSC-standard display format, for example, actuator provides horizontal scanning at a frequency of about 15 kHz, and actuator 50V provides scanning at a frequency of about 60 Hz. Accordingly, actuator 50H could be configured with a resonant deflection frequency range 156 that includes the nominal 15 kHz operating frequency. Display light source 204 can be any monocolor or multi-color focused or collimated source that is modulated in a pixel-by-pixel basis.

FIG. 24 is a schematic side view illustrating operation of actuators 50H and 50V with light source 204 and a generally static fold mirror 206. Actuators 50H and 50V, together with fold mirror 206, are formed on a common substrate 208 (as shown), or alternatively on separate generally co-planar substrates. In FIG. 24, actuators 50H and 50V oscillate out of the plane of substrate 208 about respective transverse (e.g., perpendicular, as shown) axes 210 and 212. Light beam 202 from light source 204 reflects from mirror 86H to fold mirror 206 as a light beam segment 202A, and then reflects from fold mirror 206 to 86V as a light beam segment 202B.

Figure 25:
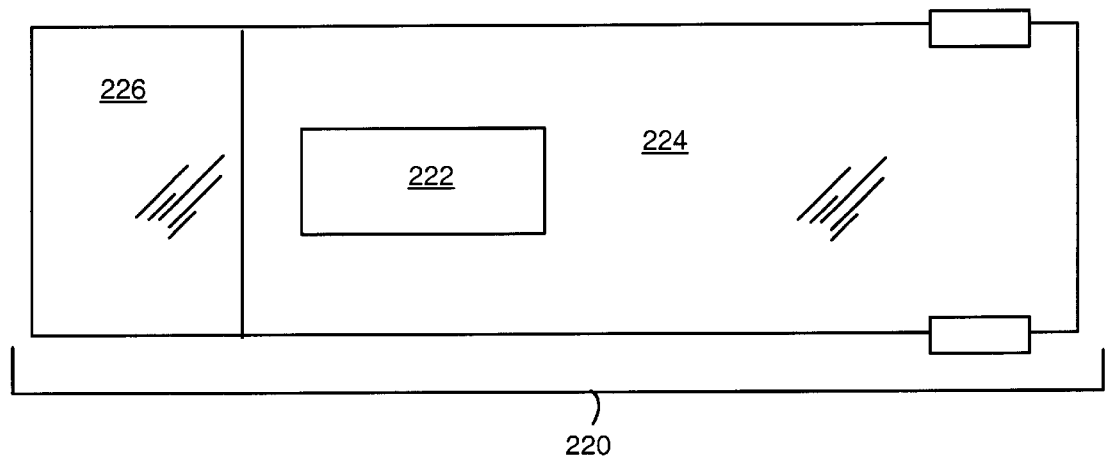
FIGS. 25 and 26 are respective plane and side views of a fold mirror used in the video raster scanner of FIG. 24.
Figure 26:
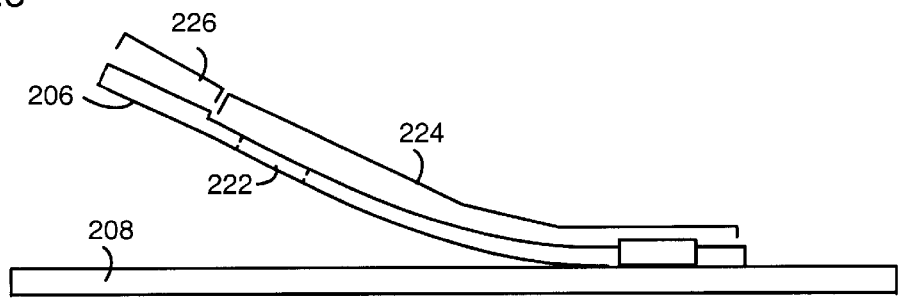

FIGS. 25 and 26 are respective plane and side views of fold mirror 206, which is shown alone for purposes of clarity. Fold mirror 206 is formed on a body 220 that is tilted or curved relative to substrate 208. An aperture 222 (illustrated schematically in FIG. 24) extends through body 220 to allow light from light source 204 to pass through body 220 to mirror 86H of actuator 50H.

Body 220 is formed as one or more semiconductor layers in accordance with the semiconductor manufacturing processes used to fabricate actuators 50H and 50V. Fold mirror 206 may therefore be simply a surface of semiconductor material. In addition, body 220 includes a major surface region 224 on which a layer of material (e.g., gold) having a coefficient of expansion different from that of the semiconductor material of body 220.

The difference between the coefficient of expansion of body 220 and the layer in region 224 induces residual stress at fabrication, the residual stress causing body 220 to tilt or curve out of the plane of substrate 208. In one implementation, body 220 includes an end region 226, which is formed as a stiffened multiple-layer structure, thereby preventing formation of the residual stress warping problems in mirror region 226. With it positioned in alignment with mirror 206, end region 226 allows body 220 and fold mirror 206 to remain generally flat. As a result, mirror 206 can more precisely reflect light from mirror 86H of actuator 50H to mirror 86V of actuator 50V.

FIG. 27 is a plan view of video raster scanner 200 showing body 220 that supports fold mirror 206 positioned over actuator 50H. Light source 204 (FIG. 24) directs light beam 202 through aperture 222 to mirror 86H of actuator 50H.

Figure 28C:
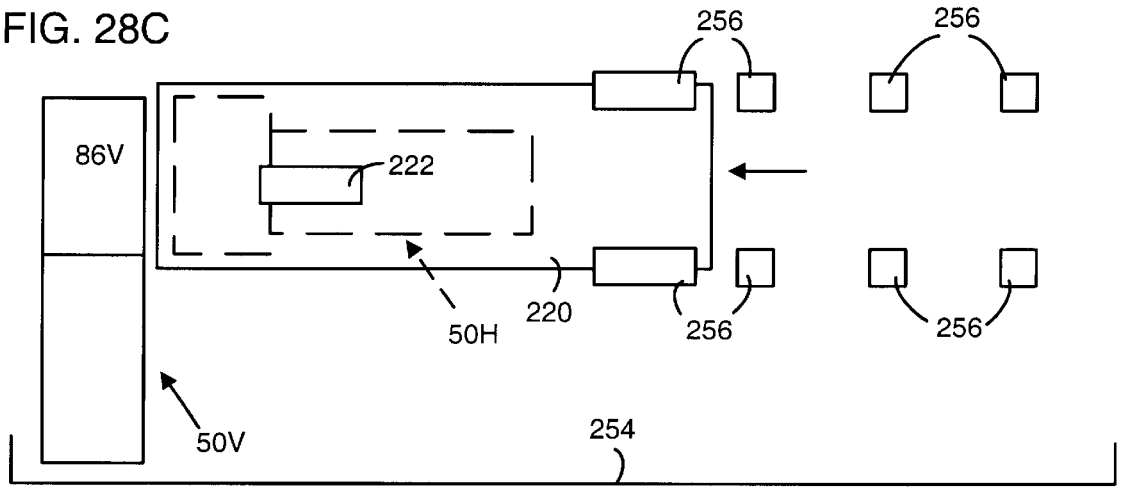

FIGS. 28A–28D illustrate schematically one implementation of successive steps in fabricating and operating video raster scanner 200. FIG. 28A illustrates an initial fabrication layout 250 of actuators 50H and 50V relative to folding mirror body 220. It will be appreciated that in initial fabrication, actuators 50H and 50V and folding mirror body 220 are formed in-plane with substrate 208.

FIGS. 28B and 28C illustrate respective fabrication layouts 252 and 254 that successively follow initial fabrication layout 250. Fabrication layouts 252 and 254 show folding mirror body 220 being moved (e.g., slid) along at least a pair of guides 256 into respective intermediate and final fabrication positions. Guides 256 are fixed to and extend from substrate 208 and extend over side margins of body 220, which is slidable relative to substrate 208 and guides 256.

Figure 28D:
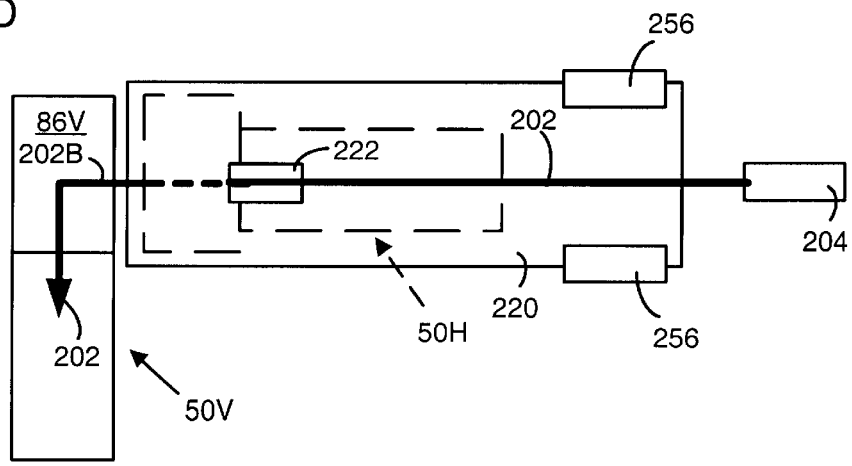

In one implementation, guides 256 are formed along the length of body 220 in initial fabrication layout 250. As body 220 is moved from initial fabrication position (layout 250) to the intermediate and final fabrication positions (layouts 252 and 254), successively more of region 224 extends beyond guides 256 and the residual stress in region 224 causes body 220 to tilt or curve away from substrate 208. It will be appreciated that body 220 may be moved from its initial to its final fabrication positions by automated (i.e., actuator) controls or by manual operator manipulation, as is know in the art. FIG. 28D is a schematic plan view illustrating operation of video raster scanner 200.

It should be noted that mirrors 86H, 86V and 206 need to be sized large enough to accommodate the light beam 202 range of movement relative to the individual moving mirrors and the motion of light beam segments 202A and 202B.

Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In view of the many possible embodiments to which the principles of our invention may be applied, it should be recognized that the detailed embodiments are illustrative only and should not be taken as limiting the scope of our invention. Rather, I claim as my invention all such embodiments as may come within the scope and spirit of the following claims and equivalents thereto.

What is claimed is:

1. An out-of-plane actuation method for a thermal microelectrical mechanical actuator, comprising:
   applying an out-of-plane buckle bias to one or more elongated thermal buckle beams that each have first and second ends secured to first and second anchors, the first and second anchors being coupled to a planar substrate; and
   directing electrical current through the thermal buckle beams via the anchors to impart thermal expansion of the thermal buckle beams and motion of them away from the substrate, thereby to activate the actuator.

2. The method of claim 1 in which the actuator further includes a pivot frame that includes a frame base secured to each buckle beam and at least one pivot arm that is coupled to the frame base at one end and includes a free end, activation of the actuator providing pivoting of the free end out-of-plane.

3. The method of claim 1 in which applying the out-of-plane buckle bias includes the buckle beams having a widened aspect ratio in which each buckle beam has a width parallel to the substrate and a thickness perpendicular thereto, the width of each buckle beam being greater than its thickness.

4. The method of claim 1 in which applying the out-of-plane buckle bias includes the actuator having a spacing pad extending from the substrate under each buckle beam.

5. The method of claim 1 in which applying the out-of-plane buckle bias includes the actuator having dimples formed near the ends of the buckle beams.

6. The method of claim 1 in which directing electrical current through the thermal buckle beams includes directing a time-varying current through the thermal buckle beams to provide time-varying activation of the actuator.

7. The method of claim 6 in which the time-varying current is cyclic and provides cyclic activation of the actuator.

8. The method of claim 6 in which the time-varying current is of a first frequency and provides cyclic activation of the actuator with deflection of a first extent that is greater than deflection of a second extent provided by a time-varying current of a second frequency that is lower than the first frequency.

9. The method of claim 6 in which the actuator has a characteristic resonant deflection frequency range and the time-varying current is of a first frequency within the resonant deflection frequency range.

10. The method of claim 9 in which the actuator has a characteristic resonant deflection frequency and the first frequency is substantially the same as the resonant deflection frequency.

11. The method of claim 2 in which directing electrical current through the thermal buckle beams includes directing a time-varying current through the thermal buckle beams to provide time-varying activation of the actuator.

12. The method of claim 11 in which the time-varying current is cyclic and provides cyclic activation of the actuator.

13. The method of claim 11 in which the time-varying current is of a first frequency and provides cyclic activation of the actuator with deflection of a first extent that is greater than deflection of a second extent provided by a time-varying current of a second frequency that is lower than the first frequency.

14. The method of claim 11 in which the time-varying current is of a first frequency within a resonant deflection frequency range.

15. The method of claim 14 in which the actuator has a characteristic resonant deflection frequency and the first frequency is substantially the same as the resonant deflection frequency.

16. A thermal microelectrical mechanical actuator, comprising:
   first and second anchors secured to a planar substrate; and
   one or more elongated thermal buckle beams that each have first and second ends secured to the respective first and second anchors the thermal buckle beams including an out-of-plane buckle bias; and
   a cyclic electrical current directed through the thermal buckle beams via the anchors to impart thermal expansion of the thermal buckle beams and motion of them away from the substrate, thereby to provide cyclic activation of the actuator.

17. The actuator of claim 16 in which the actuator further includes a pivot frame that includes a frame base secured to each buckle beam and at least one pivot arm that is coupled to the frame base at one end and includes a free end that pivots out-of-plane when the actuator is activated.

18. The actuator of claim 17 in which the cyclic current is of a first frequency and provides cyclic activation of the actuator with deflection of a first extent that is greater than deflection of a second extent provided by a cyclic current of a second frequency that is lower than the first frequency.

19. The actuator of claim 17 in which the actuator has a characteristic resonant deflection frequency range and the cyclic current is of a first frequency within the resonant deflection frequency range.

20. The actuator of claim 17 in which the actuator has a characteristic resonant deflection frequency and the cyclic current is of a first frequency that is substantially the same as the resonant deflection frequency.

21. A thermal microelectrical mechanical actuator structure formed on a planar substrate, comprising:
  first and second out-of-plane buckle beam actuators oriented transverse to each other on the substrate, each actuator including:
    plural elongated thermal buckle beams that have first and second ends secured to first and second anchors secured to the substrate,
    a pivot frame that includes a frame base secured to the buckle beams and at least one pivot arm that is coupled to the frame base at one end and includes a free end that includes an optical reflector and that pivots out-of-plane when the actuator is activated, and
    electrical couplings to direct electrical current through the thermal buckle beams via the anchors to impart thermal expansion of the thermal buckle beams and motion of them away from the substrate, thereby to activate each of the actuators;
  the structure further comprising an out-of plane fold mirror that is held on a body that is mounted on the substrate and positioned over the one of the first and second actuators so that the fold mirror is aligned to reflect light between the optical reflectors of the first and second actuators, the body including an aperture through which light can propagate to or from the optical reflectors.

22. The structure of claim 21 further comprising cyclic activation of the first and second actuators.

23. The structure of claim 21 further comprising cyclic activation of the first and second actuators at different respective first and second frequencies.

24. The structure of claim 23 further comprising cyclic activation of the first and second actuators, at least one of the first and second actuators having a characteristic resonant deflection frequency range and the cyclic activation of the at least one of the first and second actuators being of a frequency within the resonant deflection frequency range.

25. The structure of claim 21 in which the first and second actuators are generally perpendicular to each other.

26. The structure of claim 25 further comprising cyclic activation of the first and second actuators at different respective first and second frequencies.

27. The structure of claim 26 in which the first and second actuators cooperate to form a raster scan of a light beam.

28. The structure of claim 27 in which the first and second frequencies of cyclic activation correspond to NTSC-standard horizontal and vertical television scan frequencies.

29. A thermal microelectrical mechanical actuator, comprising:
  first and second anchors secured to a planar substrate; and
  one or more elongated thermal buckle beams that each have first and second ends secured to the respective first and second anchors the thermal buckle beams including an out-of-plane buckle bias;
  a pivot frame that includes a frame base secured to each buckle beam and at least one pivot arm that is coupled to the frame base at one end and includes a free end that is deflected out-of-plane when the actuator is activated; and
  a characteristic resonant deflection frequency range within which cyclic deflection of the free end of the pivot arm undergoes resonant deflection.

30. The actuator of claim 29 in which a cyclic electrical current is directed through the thermal buckle beams via the anchors to impart thermal expansion of the thermal buckle beams and motion of them away from the substrate, thereby to provide cyclic activation of the actuator.

31. The actuator of claim 30 in which the cyclic electrical current is of a first frequency within the resonant deflection frequency range.

32. The actuator of claim 30 in which the actuator has a characteristic resonant deflection frequency and the cyclic electrical current is of a first frequency that is substantially the same as the resonant deflection frequency.

33. In a thermal microelectrical mechanical actuator having an arm that undergoes cyclic deflection in response to cyclic activation, the improvement comprising:
  a characteristic resonant deflection frequency range within which cyclic deflection of the arm undergoes resonant deflection; and
  one or more elongated thermal buckle beams that are arranged on a plane, are coupled to the arm, and include an out-of-plane buckle bias to deflect the arm out-of-plane in response to cyclic activation.

34. The actuator of claim 33 in which cyclic activation includes directing a cyclic electrical current through the thermal buckle beams to impart thermal expansion of the thermal buckle beams and motion of them away from the substrate.

35. The actuator of claim 34 in which the cyclic electrical current is of a first frequency within the resonant deflection frequency range.

36. The actuator of claim 34 in which the actuator has a characteristic resonant deflection frequency and the cyclic electrical current is of a first frequency that is substantially the same as the resonant deflection frequency.

* * * * *